United States Patent [19]
Golab

[11] Patent Number: 5,796,261
[45] Date of Patent: Aug. 18, 1998

[54] METHOD AND DEVICE FOR DETECTING SOLENOID ACTUATION

[75] Inventor: Pawel J. Golab, Birmingham, Mich.

[73] Assignee: Chrysler Corporation, Auburn Hills, Mich.

[21] Appl. No.: 697,113

[22] Filed: Aug. 20, 1996

Related U.S. Application Data

[63] Continuation of Ser. No. 436,551, May 8, 1995, abandoned.
[51] Int. Cl.$^6$ .................................................. G01R 31/60
[52] U.S. Cl. ............................ 324/705; 324/418; 324/415
[58] Field of Search ............................ 324/705, 415, 324/418, 423; 340/644; 73/168

[56] References Cited

U.S. PATENT DOCUMENTS

| | | | |
|---|---|---|---|
| 3,828,247 | 8/1974 | Kirsch et al. | 324/418 |
| 4,209,739 | 6/1980 | Paice | 324/415 |
| 4,345,288 | 8/1982 | Kampf et al. | 361/31 |
| 4,509,088 | 4/1985 | Profio | 361/29 |
| 4,851,959 | 7/1989 | Stumpf | 361/159 |
| 4,939,928 | 7/1990 | Carle et al. | |
| 4,949,752 | 8/1990 | Nogle et al. | |
| 4,980,793 | 12/1990 | Glowczewski et al. | |
| 4,990,854 | 2/1991 | Friz | 324/418 |
| 5,153,522 | 10/1992 | Sano | 324/418 |
| 5,182,517 | 1/1993 | Thelen et al. | 324/418 |
| 5,243,296 | 9/1993 | Ando et al. | 324/418 |
| 5,256,973 | 10/1993 | Thee et al. | 324/418 |
| 5,347,419 | 9/1994 | Caron et al. | 361/154 |

FOREIGN PATENT DOCUMENTS

| | | | |
|---|---|---|---|
| 0176950 | 10/1990 | Japan | 324/423 |

*Primary Examiner*—Maura K. Regan
*Attorney, Agent, or Firm*—Mark P. Calcaterra

[57] ABSTRACT

A solenoid actuation detection device for detecting actuation of an armature of a solenoid includes a sensor for sensing electric current flowing through a solenoid, a peak detector for receiving the sensing signal and for creating a peak signal from the sensing signal, and a comparator for comparing the two signals to determine when an armature of the solenoid was actuated.

10 Claims, 2 Drawing Sheets

5,796,261

1

METHOD AND DEVICE FOR DETECTING SOLENOID ACTUATION

This is a continuation of U.S. patent application Ser. No. 08/436,551, filed May 8, 1995, now abandoned.

BACKGROUND OF THE INVENTION

1. Field of the Invention

The present invention relates generally to solenoids and, more particularly, to a method and device used to detect when an armature of a solenoid has been actuated.

2. Description of the Related Art

Solenoids are frequently used in motor vehicles. The solenoids are used to selectively actuate and deactuate mechanisms and subsystems of the motor vehicle, e.g., valves in an automatic transmission.

Problems may arise, however, when a subsystem fails to operate properly due to a solenoid malfunction. Solenoids may be difficult to physically access to test and verify that the solenoid is the source of the malfunction. Likewise, the solenoids, once placed in a subsystem, may be difficult to test to determine if the solenoid is operating according to the design parameters used to manufacture the solenoid because, as previously stated, the solenoids may be difficult to access.

SUMMARY OF THE INVENTION

It is, therefore, one object of the present invention to provide a method and device for detecting solenoid actuation.

It is another object of the present invention to provide a simple, cost-effective method and device to accurately test solenoids to determine the functionality thereof.

To achieve the foregoing objects, the present invention is a solenoid actuation detection device for detecting actuation of an armature of a solenoid. The solenoid actuation detection device includes a sensor for sensing an electric current flowing through the solenoid. The sensor creates a sensing signal based on the electric current. The solenoid actuation detection device also includes a peak detector for receiving the sensing signal and for creating a peak signal from the sensing signal. The solenoid actuation detection device further includes a comparator for comparing the sensing signal to the peak signal to determine when the armature of the solenoid was actuated.

One advantage of the present invention is that a method and device is provided for detecting actuation of a solenoid. Another advantage of the present invention is that the method and device detects when an armature of the solenoid has moved. A further advantage of the present invention is that the solenoid actuation detection device is a simple cost effective device to accurately test solenoids to determine the functionality thereof.

Other objects, features and advantages of the present invention will be readily appreciated as the same becomes better understood after reading the subsequent description when considered in conjunction with the accompanying drawings.

2

Figure 2:
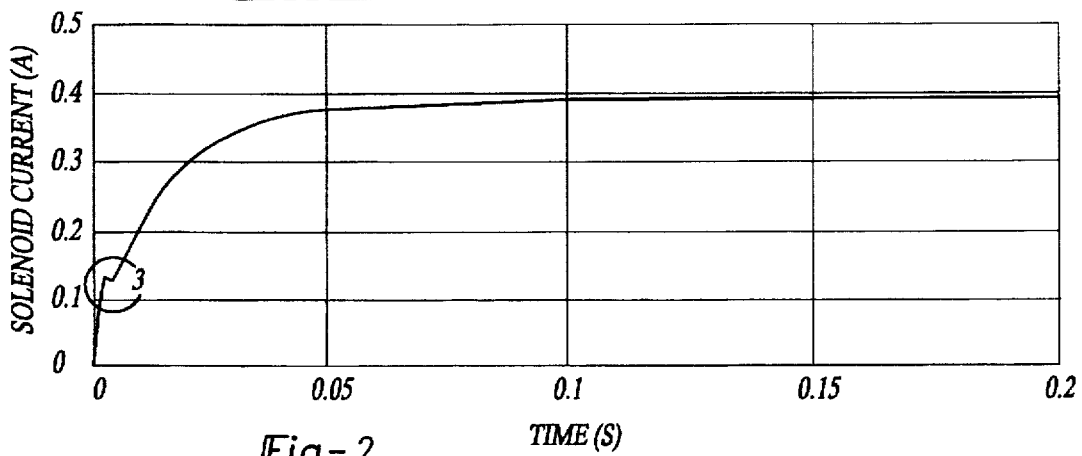
FIG. 2 is a graph of current flowing through a solenoid of FIG. 1 as a function of time.
Figure 3:
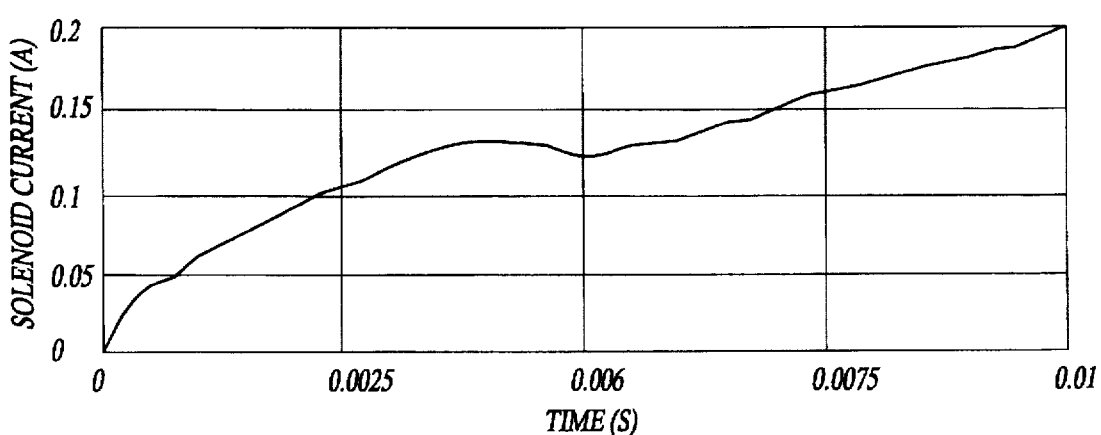

FIG. 3 is an expanded view of circle 3 in FIG. 2.

Figure 1:
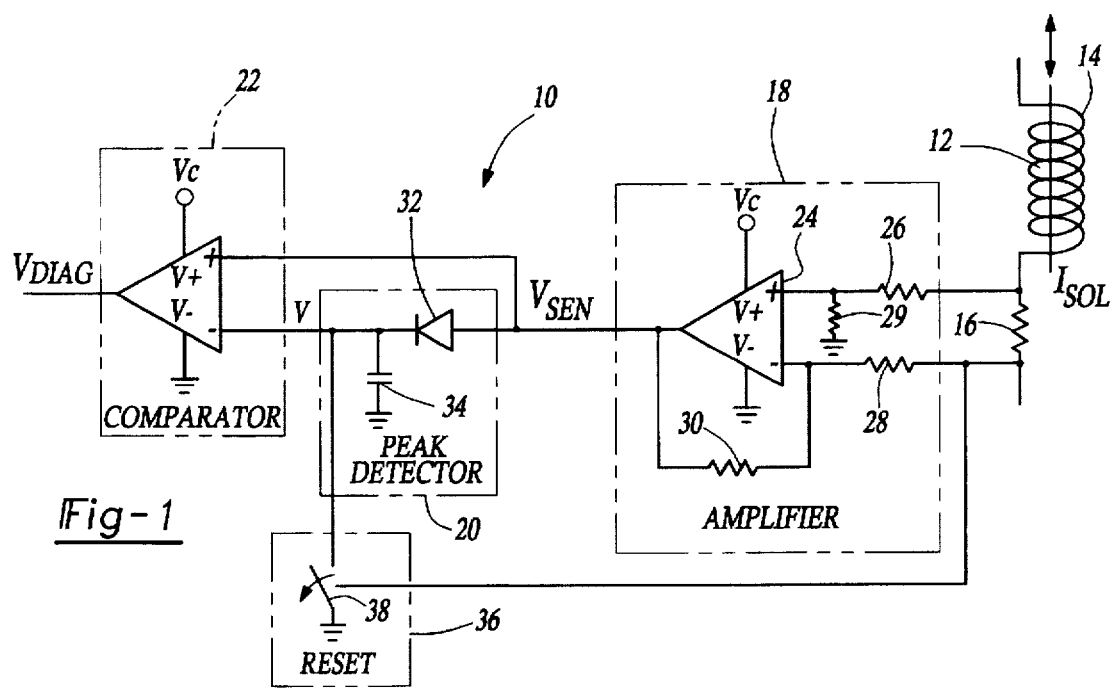
FIG. 1 is a schematic view of a device for detecting solenoid actuation according to the present invention.
Figure 4:
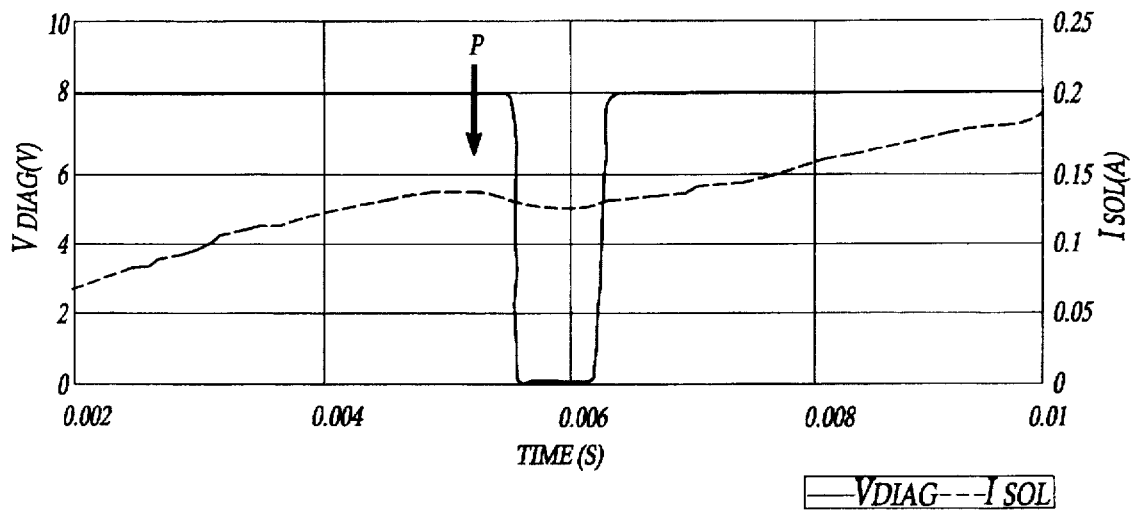

FIG. 4 is a graph of a diagnostic voltage and current passing through the solenoid of FIG. 1 as a function of time.

Figure 5:
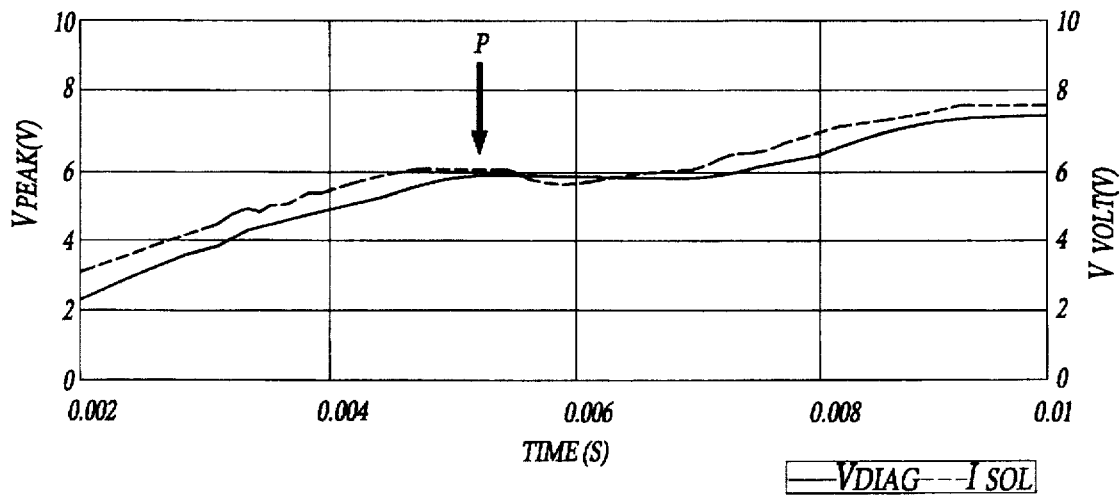

FIG. 5 is a graph representing sensing and peak signals as a function of time.

DESCRIPTION OF THE PREFERRED EMBODIMENT(S)

Referring to FIG. 1, a solenoid actuation detection device, according to the present invention, is generally shown at 10. The solenoid actuation detection device 10 detects movement of an armature 12 of a solenoid 14. The armature 12 moves in response to an electromagnetic force created by a coil or windings of the solenoid 14 when electric current $I_{sol}$ is sent through the windings of the solenoid 14 by an electronic controller (not shown). The armature 12 is used to remotely actuate and de-actuate a member such as a valve (not shown) of a lock-up or overdrive solenoid-actuated valve (not shown) in an automatic transmission (not shown). Such a solenoid-actuated valve for an automatic transmission is disclosed in U.S. Pat. No. 4,875,391 to Leising et al.

The solenoid actuation detection device 10 includes a sensor 16 which senses the electric current $I_{sol}$ flowing through the solenoid 14. The sensor 16 creates a sensing signal $V_{sen}$, as illustrated in FIG. 5, which is based on the electric current $I_{sol}$.

In one embodiment, the solenoid actuation detection device 10 includes an amplifier 18 electrically connected to the sensor 16 to amplify the sensing signal $V_{sen}$. The sensor 16 is a sensing resistor which is electrically connected to both the solenoid 14 and an amplifier 18 to be described. The solenoid actuation detection device 10 further includes a peak detector 20 electrically connected to the amplifier 18 which receives the sensing signal $V_{sen}$ and creates a peak signal $V_{peak}$ from the sensing signal $V_{sen}$. The solenoid actuation detection device 10 includes a comparator 22 for comparing the sensing signal $V_{sen}$ to the peak signal $V_{peak}$ to determine when the armature 12 of the solenoid 14 was actuated. More specifically, a peak in the electric current $I_{sol}$ is created when the armature 12 of the solenoid 14 moves due to the electromagnetic forces created by the windings of the solenoid 14. It should be appreciated that detection of this peak is a detection of movement of the armature 12.

Because the peak in the electric current $I_{sol}$ is on the order of 1/100th of an amp, the amplifier 18 amplifies a voltage corresponding to the electrical current $I_{sol}$ so that the solenoid actuation detection device 10 may affirmatively detect the peak. The amplifier 18 includes an operational amplifier 24 having inverting and non-inverting input terminals. The sensor 16 is electrically connected between the inverting and non-inverting input terminals. The amplifier 18 further includes two resistors 26,28, each of which are connected between one of the input terminals of the operational amplifier 24 and the sensor 16, respectively. The two resistors 26,28 are electrically connected on either side of the sensor 16. The amplifier 18 also includes a third resistor 29 electrically connected between one of the input terminals and the resistor 26 and ground. The amplifier 18 further includes a feedback resistor 30 connected between the output of the operational amplifier 24 and the inverting input thereof.

The output voltage of the operational amplifier 24 is the sensing signal $V_{sen}$. This sensing signal $V_{sen}$ is the input signal for the peak detector 20. The peak detector 20 includes a diode 32 connected between the output of the operational amplifier 24 and the comparator 22. The peak detector 20 further includes a capacitor 34 electrically connected between the diode 32, the comparator 22, and ground. The capacitor 34 is used to reduce the effect any peak might have on the sensing signal $V_{sen}$. The output of the peak detector 20 is a voltage signal $V_{peak}$. This output voltage signal $V_{peak}$ is an input into the comparator 22. Also, an input into the comparator 22 is the output sensing signal $V_{sen}$ of the operational amplifier 24. The peak signal $V_{peak}$ is inverted and added to the sensing signal $V_{sen}$. The output of the comparator 22 is a voltage signal $V_{diag}$.

Referring to FIG. 4, the output of the comparator 22 is approximately eight (8) volts when the value of the sensing signal $V_{sen}$ is greater than the absolute value of the peak signal $V_{peak}$. The output of the comparator 22, $V_{diag}$, however, drops to zero (0) volts when the absolute value of the peak signal $V_{peak}$ is greater than the value of the sensing signal $V_{sen}$.

A peak in the electrical current $I_{sol}$ is shown and expanded in FIGS. 2 and 3, respectively. In FIG. 5, the sensing signal $V_{sen}$ and the peak signal $V_{peak}$ are superimposed to compare the values thereof. By viewing FIG. 5, it is apparent that at approximately 0.006 seconds, the value of the sensing signal $V_{sen}$ is less than the value of the peak voltage $V_{peak}$. It is at this point in time that the output of the comparator 22, $V_{diag}$, drops to zero (0) volts. Therefore, a comparator output $V_{diag}$ of zero (0) volts may be received by an electronic controller (not shown) such as a transmission controller which will indicate thereto that the armature 12 of the solenoid 14 has moved.

Referring to FIG. 1, the solenoid actuation detection device 10 may include a reset subcircuit 36. The reset subcircuit 36 includes a switch 38 which connects to ground both the peak signal $V_{peak}$ and the inverting input of the operational amplifier 24. When the switch 38 is closed for each of the inputs, the signals go to zero (0) and the solenoid actuation detection device 10 may cycle through the sequence.

In operation, a method, according to the present invention, is used for detecting when the armature 12 of the solenoid 14 is actuated. The method uses the peak detector 20 and the comparator 22. The method includes the steps of sensing an electric current $I_{sol}$ as it flows through the solenoid 14 to create a sensing signal $V_{sen}$, detecting peaks in the sensing signal, and creating an output signal $V_{diag}$ identifying the peaks. A peak detector signal $V_{peak}$ is created from the sensing signal $V_{sen}$ wherein the comparator 22 compares each of the signals with each other. More specifically, the comparator 22 subtracts the peak signals $V_{peak}$ from the sensing signal $V_{sen}$.

The method further includes the step of identifying the peak in the electric current $I_{sol}$. The peak is identified when the peak detecting signal $V_{peak}$ and the sensing signal $V_{sen}$ intersect. More specifically, a peak occurs at or about the point in which the sensing signal $V_{sen}$ and the peak signal $V_{peak}$ are equal. Once the peak is identified, the peak is indicated by the comparator 22 having an output of zero (0) volts. Because the peak is so minimal, on the order of milliamps, the method includes the step of amplifying the sensing signal $V_{sen}$ before creating the peak signal $V_{peak}$.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. A solenoid actuation detection device for detecting actuation of an armature of a solenoid comprising:

a sensor for sensing an electric current flowing through a solenoid, said sensor creating a sensing signal based on the electric current;

a peak detector operatively connected to said sensor for receiving said sensing signal and for creating a peak signal from said sensing signal;

a comparator operatively connected to said sensor for receiving said sensing signal and said peak signal for comparing said sensing signal to said peak signal by subtracting said peak signal from said sensing signal to identify when said peak signal and said sensing signal intersect to determine when an armature of the solenoid was actuated; and a reset circuit electrically connected to said sensor and said peak detector to reset said sensing signal and said peak signal.

2. A solenoid actuation detection device as set forth in claim 1 including an amplifier electrically connected between said sensor and said peak detector for amplifying said sensing signal.

3. A solenoid actuation detection device as set forth in claim 1 wherein said comparator includes first and second input terminals wherein said sensing signal is received by said first input terminal and said peak signal is received by said second input terminal.

4. A solenoid actuation detection device as set forth in claim 1 wherein said sensor includes a sensing resistor electrically connected to said amplifier and the solenoid.

5. A solenoid actuation detection device as set forth in claim 4 wherein said amplifier includes an operational amplifier having inverting and non-inverting input terminals.

6. A solenoid actuation detection device as set forth in claim 5 wherein said sensing resistor is electrically connected between said inverting and non-inverting input terminals.

7. A solenoid actuation detection device as set forth in claim 1 including a reset circuit electrically connected to said sensing resistor and said peak detector to reset said sensing and said peak signals.

8. A solenoid actuation detection device as set forth in claim 1 wherein said reset circuit comprises a switch.

9. A solenoid actuation detection device as set forth in claim 1 wherein said peak detector comprises a diode and a capacitor.

10. A solenoid actuation detection device for detecting actuation of an armature of a solenoid comprising:

a sensing resistor electrically connected to a solenoid for sensing an electric current flowing through the solenoid, said sensing resistor creating a sensing signal based on the electric current;

a peak detector operatively connected to said sensing resistor for receiving said sensing signal and for creating a peak signal from said sensing signal;

an amplifier electrically connected between said sensing resistor and said peak detector for amplifying said sensing signal;

a comparator operatively connected to said sensing resistor for receiving said sensing signal and said peak signal for comparing said sensing signal to said peak signal by subtracting said peak signal from said sensing signal to identify when said peak signal and said sensing signal intersect to determine when an armature of the solenoid was actuated; and a reset circuit electrically connected between said sensing resistor and said amplifier and to said peak detector to reset said sensing signal and said peak detector signal.

* * * * *